United States Patent [19]
Mori

[11] Patent Number: 5,262,665
[45] Date of Patent: Nov. 16, 1993

[54] SEMICONDUCTOR DEVICE WITH CURRENT SENSING FUNCTION

[75] Inventor: Shogo Mori, Kariya, Japan

[73] Assignee: Kabushiki Kaisha Toyoda Jidoshokki Seisakusho, Kariya, Japan

[21] Appl. No.: 868,732

[22] Filed: Apr. 14, 1992

[30] Foreign Application Priority Data

Apr. 23, 1991 [JP] Japan ................... 3-092427

[51] Int. Cl.⁵ .............. H01L 29/72; H01L 27/06
[52] U.S. Cl. ................................ 257/378; 257/48
[58] Field of Search ............... 257/48, 273, 378, 368, 257/370, 539, 566, 577, 563

[56] References Cited

U.S. PATENT DOCUMENTS

| | | | |
|---|---|---|---|
| 3,553,541 | 4/1969 | King | 257/273 |
| 4,961,006 | 10/1990 | Pace et al. | 307/270 |
| 5,023,693 | 6/1991 | Mori et al. | 257/563 |
| 5,061,863 | 10/1991 | Mori et al. | 307/350 |

FOREIGN PATENT DOCUMENTS

| | | | |
|---|---|---|---|
| 3927307 | 4/1990 | Fed. Rep. of Germany | 257/378 |
| 4017992 | 1/1991 | Fed. Rep. of Germany | 257/563 |
| 0270276 | 10/1989 | Japan | |
| 0008369 | 1/1991 | Japan | |

Primary Examiner—Rolf Hille
Assistant Examiner—Alexander D. Williams
Attorney, Agent, or Firm—Brooks Haidt Haffner & Delahunty

[57] ABSTRACT

A semiconductor device having a first stage transistor and a second stage transistor formed on a single substrate is disclosed. The first stage transistor is a multi-source type MOS transistor. The second stage transistor is a multi-base/multi-emitter type transistor. The MOS transistor has a main source connected to the main base of the second stage transistor. The first stage MOS transistor has a sense source connected to the sense base of the second stage transistor. The collector of the second stage transistor and the drain of the first stage MOS transistor are independently formed on the substrate. A load is connected to the collectors. When a voltage is applied to the gate of the first stage transistor, the first stage and second stage transistors are turned on, permitting a collector current, emitter current and sense current to flow into the second stage transistor. The collector current running across the load is detected based on detection of the sense current.

8 Claims, 4 Drawing Sheets

SEMICONDUCTOR DEVICE WITH CURRENT SENSING FUNCTION

BACKGROUND OF THE INVENTION

1. Field of the Invention

The present invention relates to a semiconductor device, and more particularly, to a semiconductor device which has a current detecting function.

2. Description of the Related Art

A multi-base/multi-emitter type transistor T as shown in FIG. 6 has been proposed as a transistor with a current detecting function (see Japanese Unexamined Patent Publication No. 3-008369). The transistor T has a common collector C. The transistor T has two separate bases, a main base B and a sense base $B_S$, and two separate emitters, a main emitter E and a sense emitter $E_S$. A load 21 is connected to the collector of the transistor T. Constant currents $I_B$ and $I_{BS}$ in a predetermined ratio are input respectively to the main base B and sense base $B_S$ from a drive circuit 22. When a sense current $I_{ES}$ flows across a sense resistor $R_S$, the value of the sense current $I_{ES}$ is acquired by measuring a voltage at both ends of the sense resistor $R_S$. Based on that value, a collector current $I_C$ is detected. A main emitter current $I_E$ and the sense current $I_{ES}$ in a predetermined ratio run respectively through the main emitter E and the sense emitter $E_S$ without the influence of either the collector current $I_C$ or changes in the ambient temperature. It is therefore possible to detect the current with high accuracy.

The conventional transistor with a current detecting function requires that constant currents ($I_B$ and $I_{BS}$) in a predetermined ratio should be input respectively to the main base B and sense base $B_S$. This inevitably complicates the structure of the drive circuit 22. Further, the constant currents, particularly, the main base current $I_B$ flowing through the main base B is great, so that the power loss in the drive circuit 22 will increase.

SUMMARY OF THE INVENTION

It is therefore an object of the present invention to provide a current detecting semiconductor device which can be driven by a drive circuit with a simple structure and low power loss.

To achieve the above object, a semiconductor device according to the present invention includes a first stage transistor and a second stage transistor formed on a single substrate. The first stage transistor is a multi-source type MOS transistor. The second stage transistor is a multi-base/multi-emitter type transistor. The MOS transistor has a main source connected to the main base of the second stage transistor. The first stage MOS transistor has a sense source connected to the sense base of the second stage transistor. The collector of the second stage transistor and the drain of the first stage MOS transistor are independently formed on the substrate. A load is connected to the collectors. When a voltage is applied to the gate of the first stage transistor, the first stage and second stage transistors are turned on, permitting a collector current, emitter current and sense current to flow into the second stage transistor. The collector current running across the load is detected based on detection of the sense current.

In a preferred embodiment, the second stage transistor is a multi-gate/multi-source type transistor.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
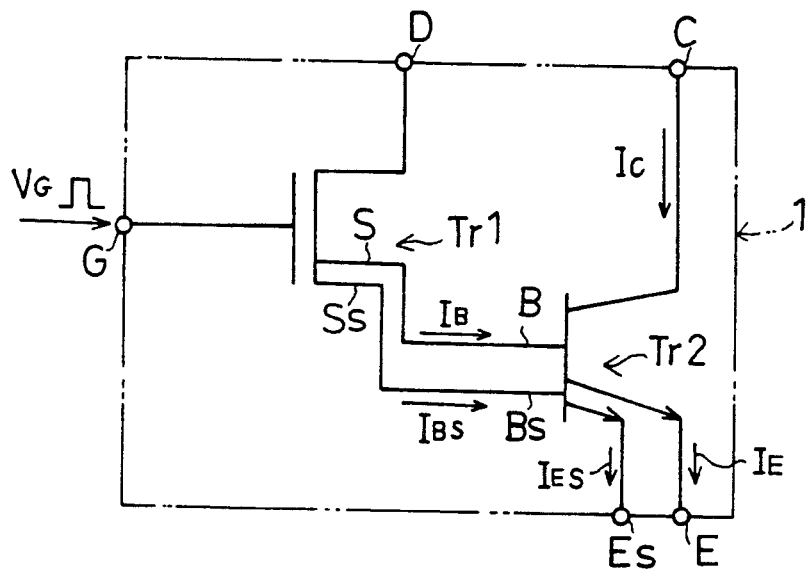
FIG. 1 is a circuit diagram illustrating the equivalent circuit of a semiconductor device according to one embodiment of the present invention.
Figure 2:
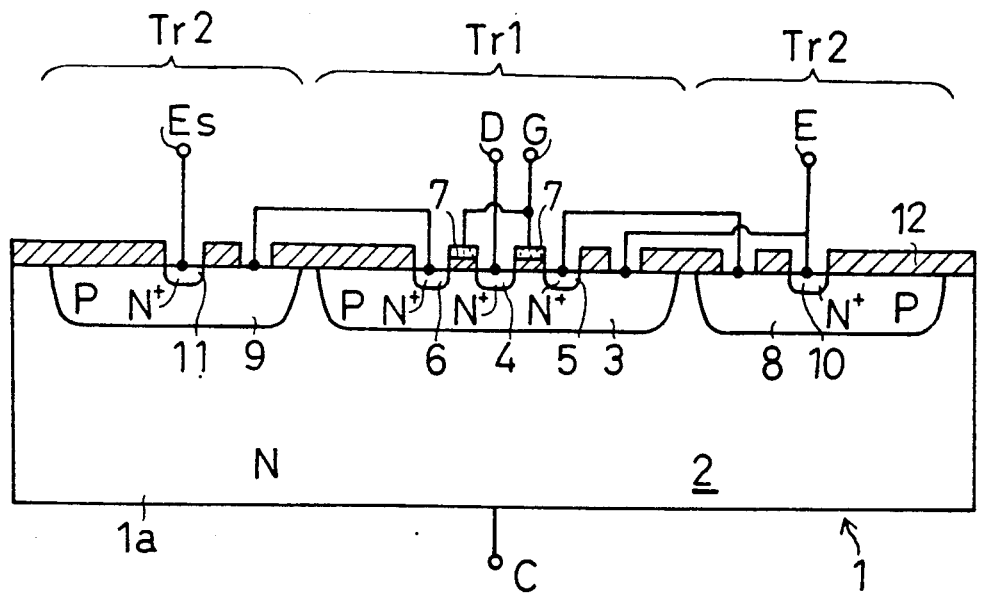
FIG. 2 is a diagrammatic side view illustrating the structure of the semiconductor device having the equivalent circuit shown in FIG. 1.
Figure 3:
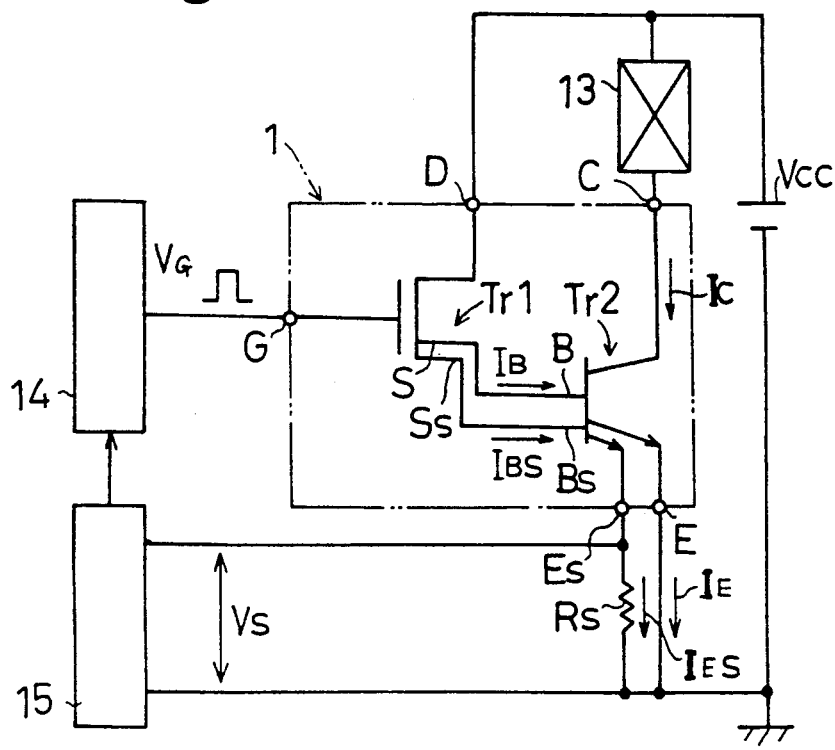
FIG. 3 is a circuit diagram showing a circuit which includes the semiconductor device shown in FIG. 1.

One preferred embodiment of the present invention will now be described referring to FIGS. 1 through 3. As shown in FIGS. 1 and 2, a semiconductor device 1 has a single N-type silicon substrate (chip) 1a, on which a first stage transistor Tr1 and a second stage transistor Tr2 are formed. The first stage transistor Tr1 is constituted of a multi-source N-type MOS transistor, and the second stage transistor Tr2 of a multi-base/multi-emitter NPN-type bipolar transistor.

The substrate 1a defines a collector region 2 of the second stage transistor Tr2. A P-well region 3 for the N-type MOS transistor is formed on the substrate 1a. The P-well region 3 includes a drain region 4, a main source region 5 and a sense source region 6 each formed of an N+ layer. Thin oxide films are formed on the surface of the P-well region 3 respectively between the drain region 4 and the main source region 5, and between the drain region 4 and the sense source region 6. Gate electrodes 7 made of polycrystalline silicon are formed on the thin oxide films. A main base region 8 and a sense base region 9 of the second stage transistor Tr2 are made of a P layer, and formed independently on the substrate 1a. The main base region 8 and the sense base region 9 respectively include a main emitter region 10 and a sense emitter region 11, both made of an N+ layer.

The first stage transistor Tr1 has a main source S connected to a main base B of the second stage transistor Tr2. The first stage transistor Tr1 has a sense source $S_S$ connected to a sense base $B_S$ of the second stage transistor Tr2. The P-well region 3 is connected to a main emitter E in order to be grounded. The surfaces of the collector region 2, the P-well region 3, the main base region 8 and the sense base region 9 are overlaid with an oxide layer ($SiO_2$) 12, excluding the electrode portions.

A description will be given of the action of the semiconductor device with such a structure when used to control the driving of a load. As shown in FIG. 3, the first stage transistor Tr1 has a drain D directly connected to a power supply $V_{CC}$, and a collector C connected via a load 13 to the power supply $V_{CC}$. The second stage transistor Tr2 has the main emitter E grounded and a sense emitter $E_S$ grounded via a sense resistor $R_S$. A gate voltage $V_G$ is applied to a gate G of the first stage transistor Tr1 from a drive circuit 14. The drive circuit 14 is driven based on a control signal from a control circuit 15. The control circuit 15 detects a voltage $V_S$ across the terminals of the sense resistor $R_S$, and controls the drive circuit 14 to prevent an overcurrent from passing through the load 13 based on the voltage detection.

When the drive circuit 14 applies the gate voltage $V_G$ to the first stage transistor Tr1, a main source current and a sense source current flow in a predetermined ratio corresponding to the gate voltage $V_G$. The main source current is supplied as a main base current $I_B$ to the main base B of the second stage transistor Tr2. The sense source current is sent as a sense base current $I_{BS}$ to the sense base $B_S$ of the second stage transistor Tr2. That transistor Tr2 is then turned on, permitting a collector current $I_C$ to pass therethrough.

If the bases of the second stage transistor Tr2 receive constant currents in a predetermined ratio, the collector current $I_C$ is divided into an emitter current $I_E$ and a sense current $I_{ES}$ in a given ratio. This current-dividing action is accurately performed without any influence of the value of the collector current or changes in ambient temperature. The collector current $I_C$ can therefore be detected with high accuracy by detecting the sense current $I_{ES}$. The saturated voltage of the second stage transistor Tr2 will not rise by connection of the first stage transistor Tr1 thereto.

Based on the sense current $I_{ES}$, the control circuit 15 detects a voltage (sense voltage) $V_S$ across the terminals of the sense resistor $R_S$, and detects the collector current $I_C$ based on the detected voltage $V_S$. The control circuit 15 controls the drive circuit 14 to prevent an overcurrent from flowing through the load 13.

As described above, the main base B and the sense base $B_S$ of the second stage transistor Tr2 receive the constant currents in a predetermined ratio corresponding to the gate voltage $V_G$ of the first stage transistor Tr1. The drive circuit 14 therefore has only to output one kind of voltage. Compared with the conventional drive circuit which requires constant currents output in a given ratio, the drive circuit 14 in this embodiment has a simpler structure. The power loss of the drive circuit 14 is also lower because that drive circuit is driven by the constant voltage.

In manufacturing the semiconductor device 1, it is possible to simultaneously fabricate the first stage transistor Tr1 and the second stage transistor Tr2. First, a P-type impurity is diffused into a predetermined portion of the N-type silicon substrate 1a, thereby providing the P-well region 3, the main base region 8 and the sense base region 9 at the same time. An N-type impurity is diffused into predetermined portions of the P-well region 3, the main base region 8 and the sense base region 9, thereby forming the drain region 4, the main source region 5, the sense source region 6, the main emitter region 10 and the sense emitter region 11 at the same time.

Figure 4:
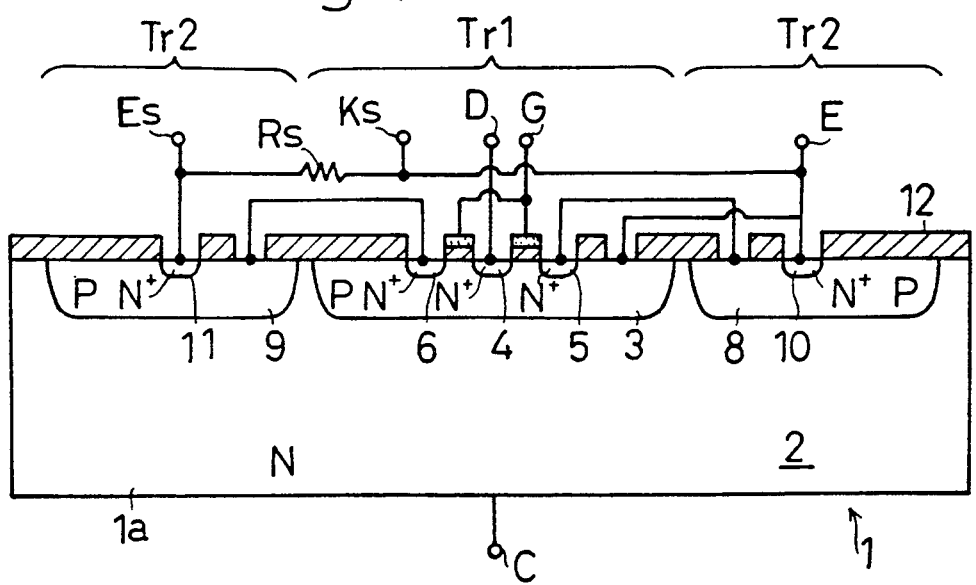
FIG. 4 is a diagrammatic side view showing the structure of a modification of the semiconductor device.
Figure 5:
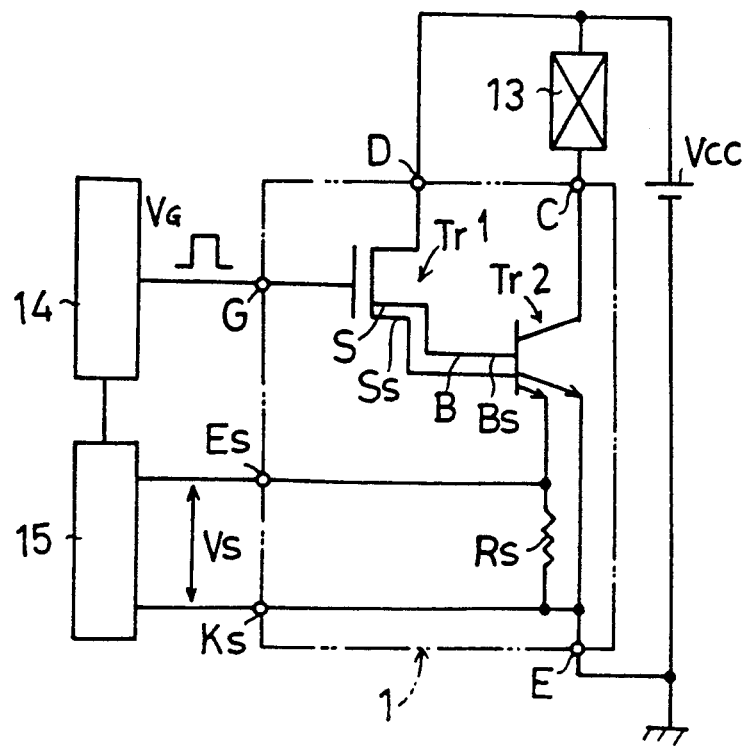
FIG. 5 is a circuit diagram of the modification.
Figure 6:
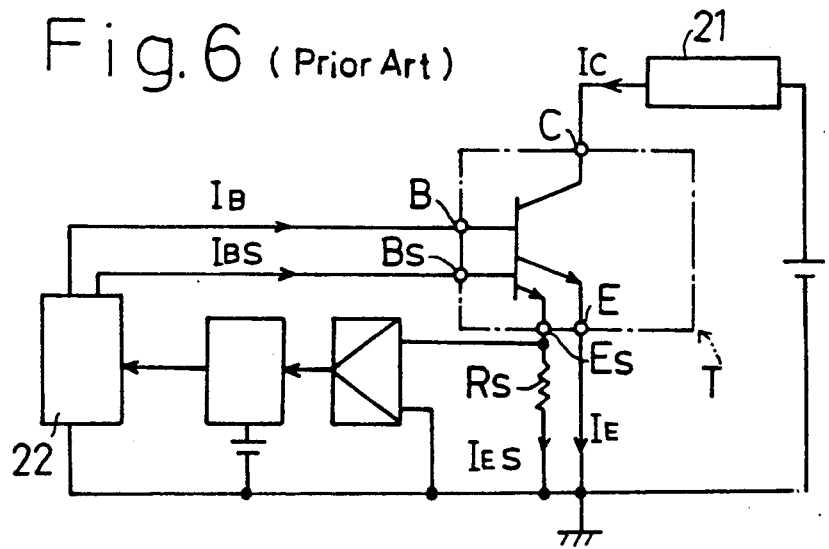
FIG. 6 is a circuit diagram illustrating a conventional semiconductor device.

The present invention is not limited to this embodiment. As shown in FIGS. 4 and 5, for example, the sense resistor $R_S$ may be formed on the substrate 1a between the sense emitter $E_S$ and the main emitter E of the second stage transistor Tr2, with a Kelvin terminal $K_S$ provided on the substrate 1a for monitoring a voltage drop between the main emitter E and the sense resistor $R_S$. The sense resistor $R_S$ is easily formed of, for example, polycrystalline silicon on the oxide film.

Figure 7:
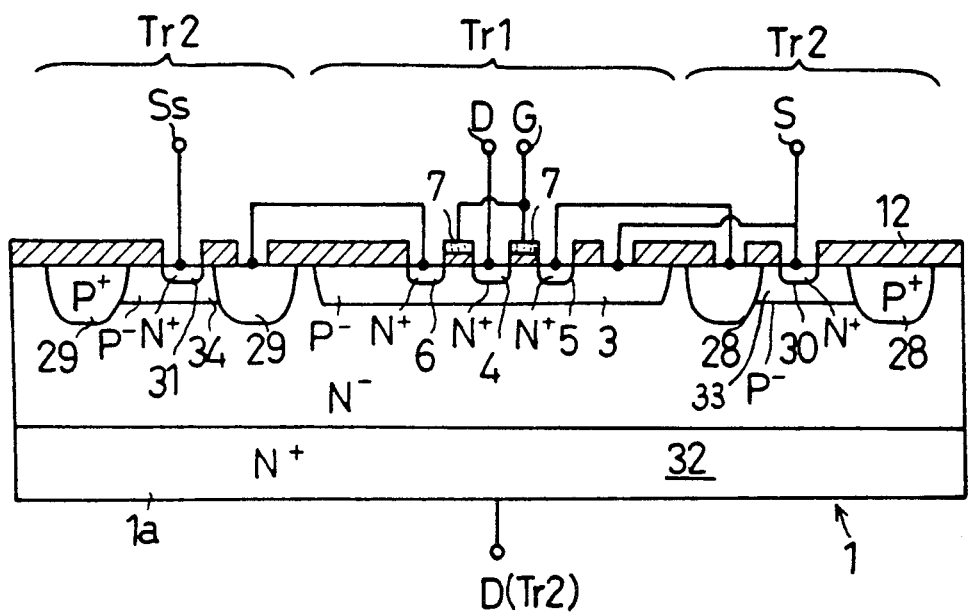
FIG. 7 is a diagram showing the structure of another modification of the semiconductor device.

Further, an N-type SIT (Static Induction Transistor) disclosed in Japanese Provisional Patent Publication No. 270276/89, for example, may be used as the second stage transistor Tr2, instead of an NPN-type transistor in the embodiment. As shown in FIG. 7, the N-type SIT has an $N^-$-type silicon substrate, on which a $P^-$-type main channel region 33 and a $P^-$-type sense channel region 34 are formed. An $N^+$-type main source region 30 and an $N^+$-type sense source region 31 are formed on the channel regions 33 and 34, respectively. A $P^+$-type main gate region 28 and a sense gate region 29 are formed around the respective source regions 30 and 31. An $N^+$-type drain region 32 is formed on the bottom surface of the substrate.

In this case, the bases B and $B_S$ of the NPN-type transistor in the embodiment correspond to the gates of the N-type SIT. The emitters E and $E_S$ in the embodiment correspond to the sources S and $S_S$, and the collector C to the drain D. This modification has the same connection of the second stage transistor to the first stage transistor as made in the previous embodiment.

P-type transistors are also available as the first stage and second stage transistors, instead of N-type transistors.

In short, according to the present invention, highly accurate current detection can be made without being influenced by the value of the current flowing across a load and a change in ambient temperature. In accordance with the gate voltage of the first stage MOS transistor, constant currents in a predetermined ratio are applied to the main base (or the main gate) and the sense base (or the sense gate) of the second stage transistor. Thus, a drive circuit which drives a semiconductor device can have a simpler structure. Moreover, power loss of the drive circuit can be minimized because it can operate on a constant voltage. Further, the first stage transistor is fabricated at the same time as the formation of the second stage transistor in the fabricating process for the second stage transistor, so that the fabricating steps will not be complicated.

What is claimed is:

1. A semiconductor device comprising:
    a substrate;
    a first stage transistor provided on the substrate, the first stage transistor including a multi-source type MOS
    transistor; and
    a second stage transistor provided on the substrate, the second stage transistor being of one from the group consisting of a multi-base/multi-emitter type and a multi-gate/multi-source type transistor,
    wherein the first stage MOS transistor having a main source connected to one of a main base and a main gate of the second stage transistor, and having a sense source connected to one of a sense base and a sense gate of the second stage transistor, and
    wherein a drain of the first stage MOS transistor and one from a group consisting of a collector and a drain of the second stage transistor are formed independently on the substrate.

2. A semiconductor device according to claim 1, wherein the second stage transistor is a multi-base/multi-emitter NPN-type bipolar transistor.

3. A semiconductor device according to claim 2, wherein a load is connected between the drain of the first stage transistor and the collector of the second stage transistor.

4. A semiconductor device according to claim 3, further comprising:
   a power supply connected between the load and a main emitter of the second stage transistor;
   a drive circuit for sending a drive signal to the first stage transistor;
   a sense resistor connected to a sense emitter of the second stage transistor; and
   a control circuit for detecting a voltage across the terminals of the sense resistor, and being capable of controlling the drive circuit based on said voltage.

5. A semiconductor device according to claim 1, wherein the second stage transistor is a multi-gate/multi-source N-type static induction transistor.

6. A semiconductor device according to claim 5, wherein a load is connected between the drain of the first stage transistor and the drain of the second stage transistor.

7. A semiconductor device according to claim 6, further comprising:
   a power supply connected between the load and a main source of the second stage transistor;
   a drive circuit for sending a drive signal to the first stage transistor;
   a sense resistor connected to a sense source of the second stage transistor; and
   a control circuit for detecting a voltage across the terminals of the sense resistor, and being capable of controlling the drive circuit based on said voltage.

8. A circuit with a semiconductor device comprising:
   a substrate;
   a first stage transistor provided on the substrate, the first stage transistor comprising a multi-source type MOS transistor;
   a second stage transistor provided on the substrate, the second stage transistor being of a multi-base/-multi-emitter type, wherein
      the first stage MOS transistor has a main source connected to a main base of the second stage transistor, and has a sense source connected to a sense base of the second stage transistor, and
      a collector of the second stage transistor and a drain of the first stage MOS transistor are independently formed on the substrate;
   a load connected between the drain of the first stage transistor and the collector of the second stage transistor;
   a power supply connected between the load and a main emitter of the second stage transistor;
   a drive circuit for sending a drive signal to the first stage transistor;
   a sense resistor connected to a sense emitter of the second stage transistor; and
   a control circuit for detecting a voltage across the terminals of the sense resistor, the control circuit being capable of controlling the drive circuit based on said voltage.

* * * * *